(12) United States Patent
Yoshikawa et al.

(10) Patent No.: US 10,109,501 B2
(45) Date of Patent: Oct. 23, 2018

(54) MANUFACTURING METHOD OF SEMICONDUCTOR DEVICE HAVING A VOLTAGE RESISTANT STRUCTURE

(71) Applicants: FUJI ELECTRIC CO., LTD., Kanagawa (JP); Octec, Inc., Tokyo (JP)

(72) Inventors: Koh Yoshikawa, Matsumoto (JP); Haruo Nakazawa, Matsumoto (JP); Kenichi Iguchi, Matsumoto (JP); Yasukazu Seki, Matsumoto (JP); Katsuya Okumura, Tokyo (JP)

(73) Assignees: FUJI ELECTRIC CO., LTD., Kanagawa (JP); Octec, Inc., Tokyo (JP)

( * ) Notice: Subject to any disclaimer, the term of this patent is extended or adjusted under 35 U.S.C. 154(b) by 0 days.

(21) Appl. No.: 15/693,489

(22) Filed: Sep. 1, 2017

(65) Prior Publication Data

US 2018/0006125 A1  Jan. 4, 2018

Related U.S. Application Data

(63) Continuation of application No. 15/279,453, filed on Sep. 29, 2016, now Pat. No. 9,786,749.

(30) Foreign Application Priority Data

Nov. 20, 2015  (JP) .................................. 2015-227340

(51) Int. Cl.
  *H01L 21/44*  (2006.01)
  *H01L 21/56*  (2006.01)
  (Continued)

(52) U.S. Cl.
  CPC ............ *H01L 21/56* (2013.01); *H01L 21/045* (2013.01); *H01L 21/283* (2013.01); *H01L 21/31* (2013.01);
  (Continued)

(58) Field of Classification Search
  CPC ............ H01L 29/405; H01L 29/66712; H01L 21/283; H01L 29/7811; H01L 29/66136;
  (Continued)

(56) References Cited

U.S. PATENT DOCUMENTS

2002/0050913 A1\* 5/2002 Imai ...................... C04B 35/453
                                                                338/21
2002/0145172 A1\* 10/2002 Fujishima ............. H01L 29/402
                                                                257/487

(Continued)

FOREIGN PATENT DOCUMENTS

JP  2002-185015 A  6/2002
JP  2007-503128 A  2/2007

(Continued)

OTHER PUBLICATIONS

U.S. Appl. No. 15/279,453, filed Sep. 29, 2016.

*Primary Examiner* — Shouxiang Hu

(57) ABSTRACT

A semiconductor device having a voltage resistant structure in a first aspect of the present invention is provided, comprising a semiconductor substrate, a semiconductor layer on the semiconductor substrate, a front surface electrode above the semiconductor layer, a rear surface electrode below the semiconductor substrate, an extension section provided to a side surface of the semiconductor substrate, and a resistance section electrically connected to the front surface electrode and the rear surface electrode. The extension section may have a lower permittivity than the semiconductor substrate. The resistance section may be provided to at least one of the upper surface and the side surface of the extension section.

3 Claims, 16 Drawing Sheets

(51) Int. Cl.
| | |
|---|---|
| *H01L 29/40* | (2006.01) |
| *H01L 21/31* | (2006.01) |
| *H01L 29/66* | (2006.01) |
| *H01L 29/417* | (2006.01) |
| *H01L 29/78* | (2006.01) |
| *H01L 21/283* | (2006.01) |
| *H01L 29/861* | (2006.01) |
| *H01L 21/76* | (2006.01) |
| *H01L 21/04* | (2006.01) |
| *H01L 29/16* | (2006.01) |
| *H01L 29/20* | (2006.01) |

(52) U.S. Cl.
CPC ............ *H01L 21/76* (2013.01); *H01L 29/402* (2013.01); *H01L 29/405* (2013.01); *H01L 29/408* (2013.01); *H01L 29/417* (2013.01); *H01L 29/66136* (2013.01); *H01L 29/66712* (2013.01); *H01L 29/7811* (2013.01); *H01L 29/861* (2013.01); *H01L 29/1608* (2013.01); *H01L 29/2003* (2013.01)

(58) Field of Classification Search
CPC ..... H01L 29/408; H01L 21/31; H01L 29/861; H01L 29/402; H01L 29/417; H01L 29/1608; H01L 29/2003; H01L 21/049; H01L 21/045; H01L 21/56; H01L 21/76
See application file for complete search history.

(56) References Cited

U.S. PATENT DOCUMENTS

| | | | |
|---|---|---|---|
| 2007/0090470 | A1 | 4/2007 | Heringa |
| 2008/0315299 | A1* | 12/2008 | Saito ................... H01L 29/7811 257/329 |
| 2013/0069109 | A1 | 3/2013 | Matsuda et al. |
| 2013/0069145 | A1 | 3/2013 | Kawano et al. |
| 2014/0217496 | A1* | 8/2014 | Kachi ................. H01L 29/0696 257/330 |
| 2015/0115285 | A1 | 4/2015 | Kinoshita et al. |
| 2016/0064477 | A1* | 3/2016 | Blank .................. H01L 29/407 257/488 |

FOREIGN PATENT DOCUMENTS

| | | |
|---|---|---|
| JP | 2008-016726 A | 1/2008 |
| JP | 2008-251772 A | 10/2008 |
| JP | 2013-065719 A | 4/2013 |
| JP | 2013-080893 A | 5/2013 |
| JP | 2013-232564 A | 11/2013 |
| JP | 2013-251338 A | 12/2013 |

* cited by examiner

MANUFACTURING METHOD OF SEMICONDUCTOR DEVICE HAVING A VOLTAGE RESISTANT STRUCTURE

CROSS-REFERENCE TO RELATED APPLICATIONS

This application is a continuation of U.S. patent application Ser. No. 15/279,453, filed on Sep. 29, 2016, which claims priority to Japanese Patent Application No. 2015-227340, filed on Nov. 20, 2015, the contents of each of which are hereby incorporated herein by reference in their entirety.

BACKGROUND

1. Technical Field

The present invention relates to a semiconductor device and a manufacturing method of the semiconductor device.

2. Related Art

Conventionally, a trench including an insulator has been provided to a terminal end of a semiconductor element (for example, refer to Patent Document 1 to Patent Document 4). Also, an insulating material has been provided to regions which are the insulating material is sandwiched from top and bottom by capacitive voltage coupling regions made of metal that is formed integrally with electrodes, the regions extending over a terminal end from a vicinity of a p-n junction (for example, refer to Patent Document 5).

PRIOR ART REFERENCE

Patent Document

[Patent Document 1] Japanese Patent Application Publication No. 2013-251338
[Patent Document 2] Japanese Patent Application Publication No. 2013-080893
[Patent Document 3] Japanese Patent Application Publication No. 2013-065719
[Patent Document 4] Japanese Patent Application Publication No. 2008-016726
[Patent Document 5] Japanese Unexamined Patent Application Publication No. 2007-503128

SUMMARY

However, in a case where a trench including an insulator is provided, since the trench is provided to a part of a substrate, there is a problem that an active region to make current flow is reduced by the amount of region where the trench is provided. Also, in a case where an insulating material is sandwiched only from top and bottom by capacitive voltage coupling regions, equipotential lines extending from a p-n junction to the insulating material become to steeply head toward the capacitive voltage coupling regions on a boundary between the p-n junction and the insulating material. For this reason, there is a risk that an electric field is focused on the boundary between the p-n junction and the insulating material and then an insulation breakdown occurs.

In a first aspect of the present invention, a semiconductor device having a voltage resistant structure is provided. The semiconductor device may comprise a semiconductor substrate, a semiconductor layer on the semiconductor substrate, a front surface electrode above the semiconductor layer, a rear surface electrode below the semiconductor substrate, an extension section provided to a side surface of the semiconductor substrate, and a resistance section electrically connected to the front surface electrode and the rear surface electrode. The extension section may have a lower permittivity than the semiconductor substrate. The resistance section may be provided to at least one of an upper surface and a side surface of the extension section.

The resistance section may be provided all over the side surface of the extension section.

The resistance section may be provided all over the upper surface of the extension section.

The extension section may include an outer part and an inner part. The outer part may be spaced from a side surface of the semiconductor substrate and surround the side surface. The inner part may be positioned between the outer part and the side surface of the semiconductor substrate. The inner part may contain resin.

The semiconductor device may further include an upper conductive member.

The upper conductive member may be provided on the extension section. The upper conductive member may electrically connect the front surface electrode to the resistance section.

An outer end of the upper conductive member may be positioned above the inner part of the extension section. Also, The outer end of the upper conductive member may be positioned above the outer part of the extension section.

An upper surface of the outer part of the extension section may be positioned upper than a boundary between the semiconductor substrate and the semiconductor layer.

The semiconductor device may further include a conductive plate and a lower conductive member. The conductive plate may be provided to a rear surface side of the rear surface electrode. The conductive plate may be electrically connected to the rear surface electrode. The lower conductive member may electrically connect the conductive plate to the resistance section provided to the side surface of the extension section.

In a second aspect of the present invention, a manufacturing method of a semiconductor device having a voltage resistant structure is provided. The manufacturing method of the semiconductor device may include a step of fixing a rear surface electrode provided below a semiconductor substrate and an outer part on a conductive plate via a conductive adhesive, a step of forming an inner part by pouring resin between the semiconductor substrate and the outer part, a step of forming a resistance section by thermal spraying on at least one of an upper surface and a side surface of the extension section after the step of forming the inner part. The outer part may be spaced from a side surface of the semiconductor substrate, surround the side surface, and have a lower permittivity than the semiconductor substrate. The conductive plate may be electrically connected to the rear surface electrode. The extension section may have an outer part and an inner part. The resistance section may be electrically connected to the front surface electrode above the semiconductor substrate and the rear surface electrode.

The manufacturing method of the semiconductor device may further include a step of forming an upper conductive member. The upper conductive member may electrically connect the front surface electrode to the resistance section on the extension section.

The manufacturing method of the semiconductor device may further include a step of forming a lower conductive member. The lower conductive member may electrically connect the conductive plate to the resistance section provided to the outer part of the extension section.

It should be noted that the summary clause of the above-described invention does not necessarily describe all necessary features of the embodiments of the present invention. Also, the present invention may also be a sub-combination of the features described above.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

In the present specification, the letter "n" or "p" respectively means that electrons or holes are majority carriers. Also, regarding the superscript "+" or "−" respectively added to the letter "n" or "p", the superscript "+" indicates a higher carrier concentration when added than when not added, and the superscript "−" indicates a lower carrier concentration when added than when not added. Also, in the present specification, the letter "E" means a power of 10. For example, 1E+16 means $1 \times 10^{16}$.

Furthermore, in the present specification, an X direction and a Y direction are directions perpendicular to each other, and a Z direction is a direction perpendicular to an X-Y plane. The X direction, Y direction and Z direction constitute a so-called right-hand system. It should be noted that, in the present specification, the phrases "on" and "above" mean "at a position in the +Z direction", and the phrases "under" and "below" means "at a position in the −Z direction". Also, in the present specification, if the phrase "front surface" of a component is described, it means "the frontmost surface in the +Z direction" of the component, and if the phrase "rear surface" of a component is described, it means "the frontmost surface in the −Z direction" of the component. It should be noted that the Z direction may not be necessarily a vertical direction perpendicular to the ground surface.

Figure 1:
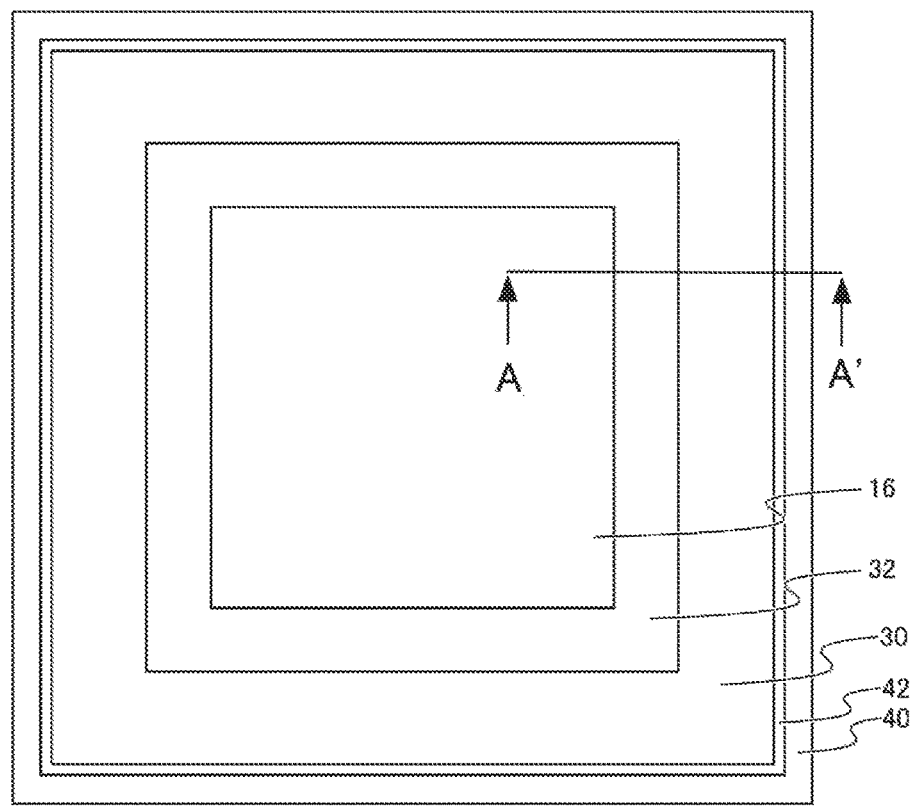
FIG. 1 is a top surface view of a semiconductor device 100 in a first embodiment.

FIG. 1 is a top surface view of the semiconductor device 100 in the first embodiment. The semiconductor device 100 of the present example includes a p-n junction diode configured with silicon carbide (hereinafter, described as SiC) of n-type and p-type. It should be noted that in FIG. 1, anode electrode 16 as a front surface electrode, an upper conductive member 32, a resistance section 30, a conductive plate 40 and a lower conductive member 42 are shown.

Figure 2:
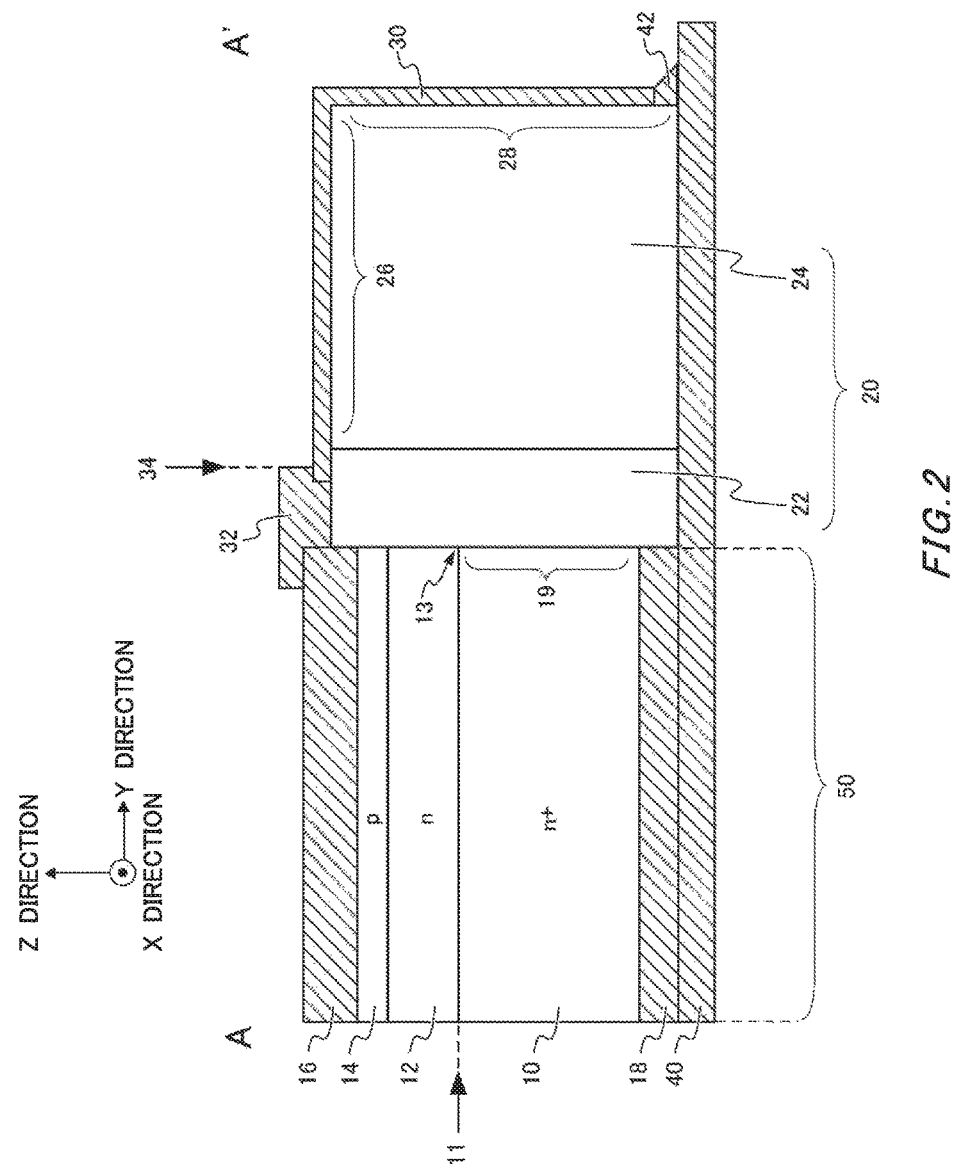
FIG. 2 is a drawing showing an A-A' cross-section of FIG. 1.

FIG. 2 is a drawing showing an A-A' cross-section of FIG. 1. The semiconductor device 100 of the present example includes a diode element section 50, an extension section 20, a resistance section 30, an upper conductive member 32 and a lower conductive member 42.

The diode element section 50 includes a cathode electrode 18 as a rear surface electrode, an $n^+$-type semiconductor substrate 10 as a semiconductor substrate, an n-type semiconductor layer 12 as a semiconductor layer, a p-type semiconductor layer 14, and the anode electrode 16. The diode element section 50 of the present example is a p-n junction diode made of SiC with a voltage resistance 1200V class. It should be noted that in another example, a rear surface electrode may be used as the anode electrode 16 and a front surface electrode may be used as the cathode electrode 18. In this case, the configuration of the diode element section 50 may be appropriately changed.

Although the semiconductor device 100 of the present example is the diode of SiC, in another example, the semiconductor device 100 may be a diode of gallium nitride or gallium oxide. Also, although the semiconductor device 100 of the present example is a p-n diode, in another example, the semiconductor device 100 may be a Schottky Barrier Diode, MOSFET or IGBT.

The $n^+$-type semiconductor substrate 10 of the present example is an $n^+$-type SiC substrate and has a thickness of 350 μm. The n-type semiconductor layer 12 is provided on the $n^+$-type semiconductor substrate 10. The n-type semiconductor layer 12 of the present example is an n-type SiC layer epitaxially formed. The n-type semiconductor layer 12 may have an impurity concentration of 1E+16 $cm^{-3}$ and a thickness of 10 μm. N-type impurities may be nitrogen (N) or phosphorus (P). It should be noted that in a case where the semiconductor layer is GaN, the n-type impurities may be silicon (Si) or oxygen (O).

The p-type semiconductor layer 14 of the present example has an impurity concentration of 1E+20 $cm^{-3}$ and a thickness of 0.5 μm. The p-type semiconductor layer 14 may be formed by ion implanting p-type impurities to the n-type semiconductor layer 12 first and then performing an activation thermal treatment thereon. The p-type impurities may be Al or boron (B). It should be noted that in a case where the semiconductor layer is GaN, the p-type impurities may be beryllium (Be), magnesium (Mg), or zinc (Zn).

The upper conductive member 32 is provided surrounding the anode electrode 16. The upper conductive member 32 of the present example is aluminum (hereinafter, described as Al) formed by thermal spraying. In another example, the upper conductive member 32 may be any other metal possible to be formed by thermal spraying, such as copper (hereinafter, described as Cu). The upper conductive member 32 has a function to electrically connect the anode electrode 16 to the resistance section 30.

The anode electrode 16 is provided above the n-type semiconductor layer 12. The anode electrode 16 may be any one of titanium (Ti), nickel (Ni), aluminum (Al), or may be an alloy and/or a laminate thereof and the like. In one example, the anode electrode 16 may be an electrode where Ti—Al and Al are laminated in this order. The cathode electrode 18 is provided below the n-type semiconductor layer 12. The cathode electrode 18 may be a laminate of Ti and Al, or may be a laminate of Ti, Ni, Al and Au. In one example, the cathode electrode 18 may be an electrode where Ti, Ni, Au and Ag are laminated in this order.

A cathode electrode of a p-n junction diode is electrically connected to the conductive plate 40. The conductive plate 40 of the present example is a plate made of Cu. The lower conductive member 42 is electrically connected to an upper surface of an end of the conductive plate 40. The lower conductive member 42 of the present example is Al which is formed by plating. The lower conductive member 42 is formed by plating due to the difficulty of forming the same by thermal spraying; however, the lower conductive member 42 may be formed by other forming methods. Also, the lower conductive member 42 may be other conductive materials rather than Al.

The resistance section 30 is electrically connected to the anode electrode 16 via the upper conductive member 32. Also, the resistance section 30 is electrically connected to the lower conductive member 42 directly. Accordingly, the resistance section 30 is electrically connected to the cathode electrode 18 via the lower conductive member 42 and the conductive plate 40.

The resistance section 30 is a conductive material having a predetermined electric resistance. The resistance section 30 of the present example is a low-resistance $Al_2O_3$ coating film formed by thermally spraying Al particles and aluminum oxide (hereinafter, described as $Al_2O_3$). The resistance section 30 has a lower resistance than a pure $Al_2O_3$ coating film and a higher resistance than pure Al. Specifically, the resistance section 30 may have a resistivity of 2.65E-8 Ωm or more and 1.0E+16 Ωm or less; preferably, the resistance section 30 may have a resistivity of 1E-7 Ωm or more and 1E+2 Ωm or less. In this case, if a reverse blocking voltage between the anode and the cathode electrodes is 1200V, the resistance section 30 may be set to have a leakage current of 1 mA/cm$^2$ or less.

The extension section 20 functions as a voltage resistant structure of the semiconductor device 100. The extension section 20 is provided in a torus-like shape being in contact with a side surface 19 of the n$^+$-type semiconductor substrate 10. In the present specification, the phrase "side surface" means the frontmost surface in ±Y direction of a component. The extension section 20 includes an inner part 22 and an outer part 24.

The inner part 22 is positioned between the outer part 24 and the side surface 19 of the n$^+$-type semiconductor substrate 10. The inner part 22 of the present example contains silicone resin. The relative permittivity of the silicone resin is about 3.5. In the present example, since silicone resin is provided to the inner part 22, it is possible to perform sealing between the n$^+$-type semiconductor substrate 10 and the outer part 24 without leaving any gaps. The length of the inner part 22 in the Y direction may be 50 μm or more. The length of the inner part 22 in the Y direction in the present example is 100 μm or more and 200 μm or less.

The outer part 24 is provided being spaced from the side surface 19 of the n$^+$-type semiconductor substrate 10 and surrounding the side surface. The outer part 24 of the present example is made of $Al_2O_3$. The relative permittivity of $Al_2O_3$ is about 9.5. On the other hand, the relative permittivity of SiC is about 10. That is, the extension section 20 has a lower permittivity than the diode element section 50 of SiC.

In the present example, since the extension section 20 as a voltage resistant structure is added to the outside of the diode element section 50, all of the n$^+$-type semiconductor substrate 10, the n-type semiconductor layer 12 and the p-type semiconductor layer 14 can be used as active regions. That is, cost per unit area in active regions can be reduced by efficiently utilizing SiC substrate areas at maximum.

The conductive plate 40 of the present example is provided on a rear surface side of the cathode electrode 18. The conductive plate 40 may be electrically connected to the cathode electrode 18 via a solder or a silver paste being conductive adhesives. The potentials of the conductive plate 40 and the cathode electrode 18 may be 0V. In contrast, the anode electrode 16 and the upper conductive member 32 may have high potentials (for example, 1200V).

The resistance section 30 is provided in contact with an upper surface 26 and a side surface 28 of the extension section 20. The phrase "upper surface" in the present specification means the frontmost surface in the +Z direction of a component. The resistance section 30 may have a thickness of 1 μm or more and 5 μm or less. From the outer end 34 of the upper conductive member 32 to the lower conductive member 42 through the resistance section 30, the voltage drops and the potential drops to 0V from a high potential (for example, 1200V). The resistance section 30 can share the potential at intervals with an equal length from the high potential (for example, 1200V) to 0V.

If no resistance section 30 is provided, equipotential lines extending from ends of the n-type semiconductor layer 12 and the p-type semiconductor layer 14 to the extension section 20 steeply head toward in up-and-down directions. In contrast, in the present example, each equipotential line can extend toward the resistance section 30 in accordance with the voltage drop at the resistance section 30. For this reason, the intervals of the equipotential lines can be equalized rather than a case having no resistance section 30. As this result, compared to the case having no resistance section 30, equipotential intervals in an outer end 13 of a boundary 11 between the n$^+$-type semiconductor substrate 10 and the n-type semiconductor layer 12 can be widened. Therefore, an electric field strength at the outer end 13 of the boundary 11 where an insulation breakdown easily occurs can be decreased. Accordingly, the voltage resistance of the semiconductor device 100 can be improved.

The resistance section 30 of the present example may be provided all over the side surface 28 of the extension section 20. Also, the resistance section 30 of the present example may be provided all over the upper surface 26 of the extension section 20. Accordingly, the resistance section 30 can share the potential all over the side surface 28 of the extension section 20 and all over the upper surface 26 of the extension section 20. In the present specification, the phrase "all over the upper surface 26" may indicate "substantially all over the upper surface 26", and specifically means 90% or more of the upper surface 26. Similarly, the phrase "all over the side surface 28" may indicate "substantially all over the side surface 28", and specifically means 90% or more of the side surface 28.

The upper conductive member 32 is provided on the extension section 20. The upper conductive member 32 ensures an electrical connection between the anode electrode 16 and the resistance section 30. Also, in the present example, the outer end 34 of the upper conductive member 32 is positioned above the inner part 22 of the extension section 20. Therefore, the potential of the upper conductive member 32 up to the outer end 34 is the same as that of the anode electrode 16. However, in the resistance section 30, the voltage drop occurs at an outer side than the outer end 34. In the present example, since the equipotential lines are distributed over the entire upper surface of the outer part 24, the distribution intervals of the equipotential lines can be made uniform, compared to a case where the outer end 34 extends up to above the outer part 24.

The lower conductive member 42 has a function to electrically connect the resistance section 30 and the conductive plate 40. The resistance section 30 is difficult to be attached to a join between the resistance section 30 and the conductive plate 40 when forming the resistance section 30 by thermal spraying. Therefore, by providing the lower conductive member 42, the electrical connection between the resistance section 30 and the conductive plate 40 can be accurately ensured. The lower conductive member 42 may be Al formed by plating.

The upper surface 26 of the outer part 24 of the extension section 20 is positioned upper than the boundary 11 between the $n^+$-type semiconductor substrate 10 and the n-type semiconductor layer 12. In the present example, the upper surface 26 of the outer part 24 is positioned upper than the p-type semiconductor layer 14. Accordingly, for example, compared to a case where the upper surface 26 of the outer part 24 is positioned lower than the boundary 11, the equipotential lines near the outer end 13 cannot be pushed downward. For this reason, the electric field strength near the outer end 13 can be relaxed. It should be noted that in another example, the upper surface 26 of the outer part 24 may be positioned upper than the anode electrode 16. Also, the upper surface 26 of the outer part 24 may be positioned lower than the anode electrode 16 and positioned upper than the boundary between the n-type semiconductor layer 12 and the p-type semiconductor layer 14.

Figure 3:
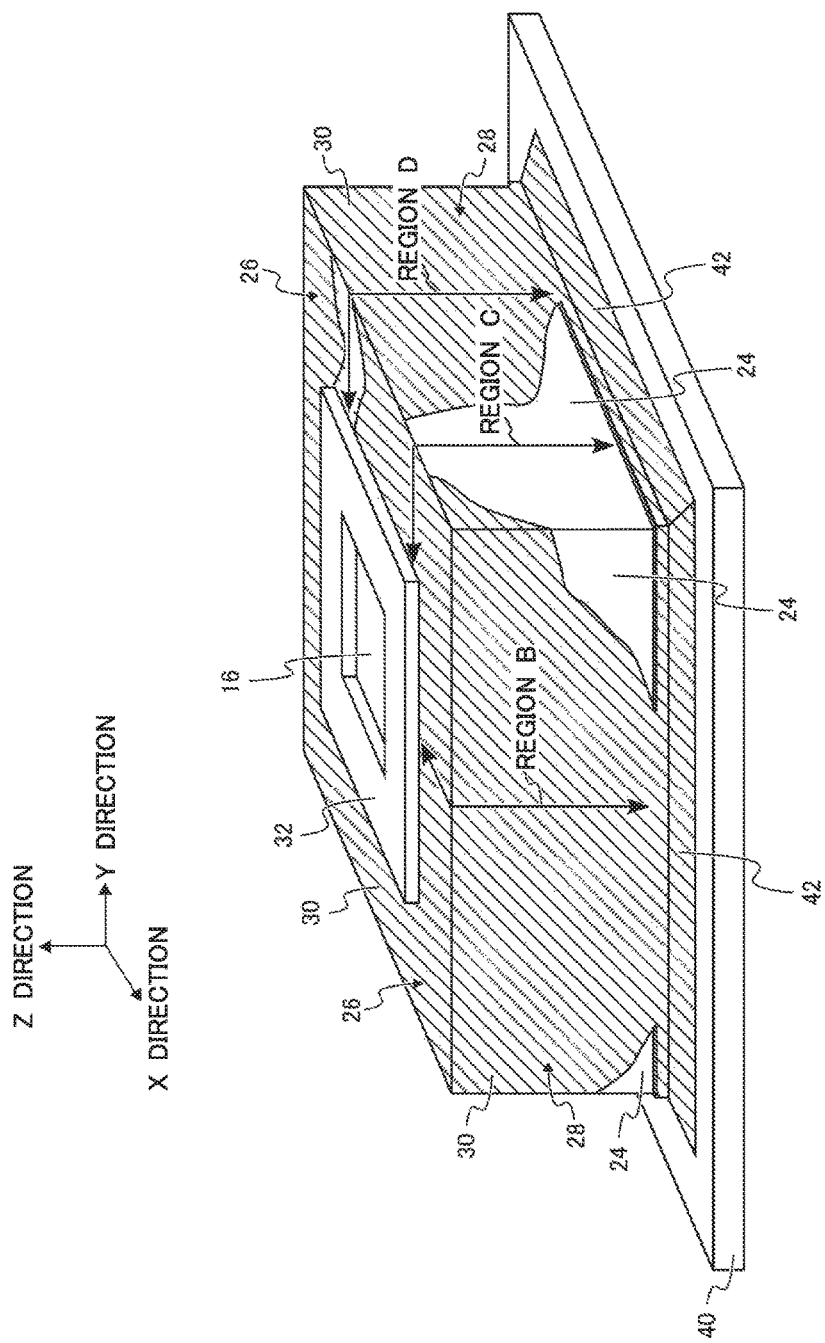
FIG. 3 is a top perspective view showing the semiconductor device 100.

FIG. 3 is a top perspective view showing the semiconductor device 100. The resistance section 30 of the present example is provided to at least one of the upper surface 26 and the side surface 28 of the extension section 20. In a region B from the upper surface 26 to the side surface 28, the resistance section 30 is provided to both of the upper surface 26 and the side surface 28. In contrast, in a region C from the upper surface 26 to the side surface 28, the resistance section 30 is provided to the upper surface 26 only. Also, in a region D from the upper surface 26 to the side surface 28, the resistance section 30 is provided to the side surface 28 only.

The resistance section 30 may not be provided to a part of the upper surface 26 or a part of the side surface 28. The resistance section 30 has a voltage resistant improvement effect as long as the resistance section 30 is coated on 90% or more of the upper surface 26 of the extension section 20 and 90% or more of the side surface 28 of the extension section 20. It should be noted that in order to understand easily, in FIG. 3, regions where the resistance section 30 is coated are illustrated in a slightly exaggerated way. Also, considering ease of viewing the drawing, only the resistance section 30 and the lower conductive member 42 are hatched.

Figure 4:
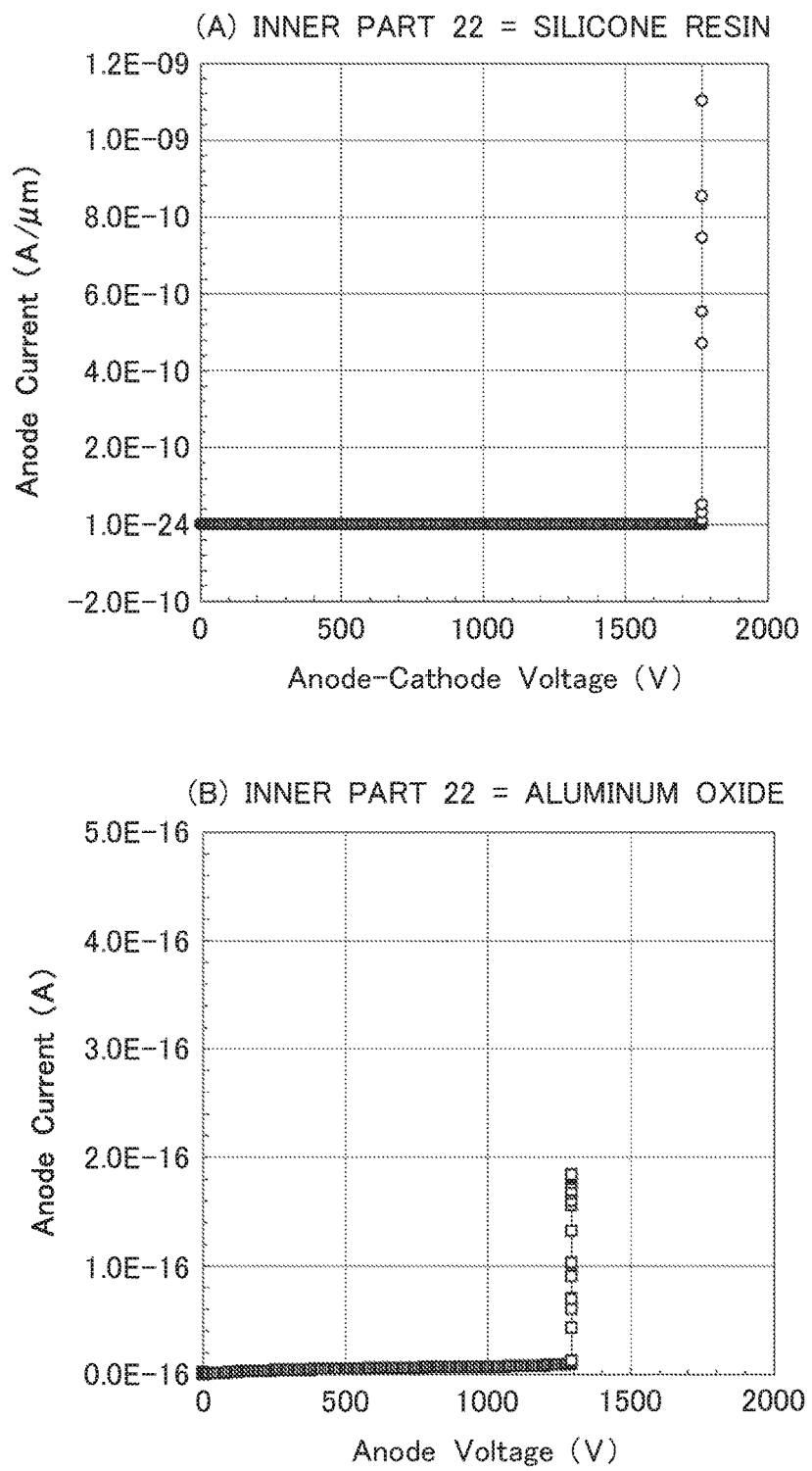
In FIG. 4, (A) is a drawing showing a result of simulating a voltage resistant waveform in a case where an inner part 22 is silicone resin. (B) is a drawing showing a result of simulating a voltage resistant waveform in a case where the inner part 22 is aluminum oxide.

In FIG. 4, (A) is a drawing showing a result of simulating a voltage resistant waveform in a case where the inner part 22 is silicone resin. In FIG. 4, (B) is a drawing showing a result of simulating a voltage resistant waveform in a case where the inner part 22 is $Al_2O_3$. In a case where the inner part 22 is silicone resin, an avalanche current flows at 1760V. That is, the avalanche resistance voltage is 1760V if the inner part 22 is the silicone resin. This resistance voltage is sufficient as an element of 1200V class. In contrast, in a case where the inner part 22 is $Al_2O_3$, an avalanche current flows at 1280V. That is, the avalanche resistance voltage is 1280V if the inner part 22 is $Al_2O_3$.

Figure 5:
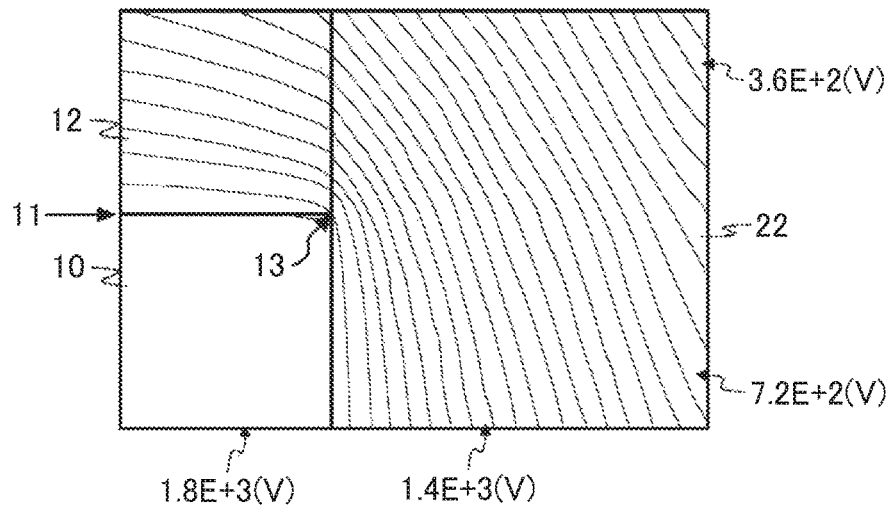
In FIG. 5, (A) is an enlarged diagram of main part showing a result of simulating a potential distribution in a case where the inner part 22 is silicone resin. (B) is an enlarged diagram of main part showing a result of simulating a potential distribution in a case where the inner part 22 is aluminum oxide.
Figure 5:
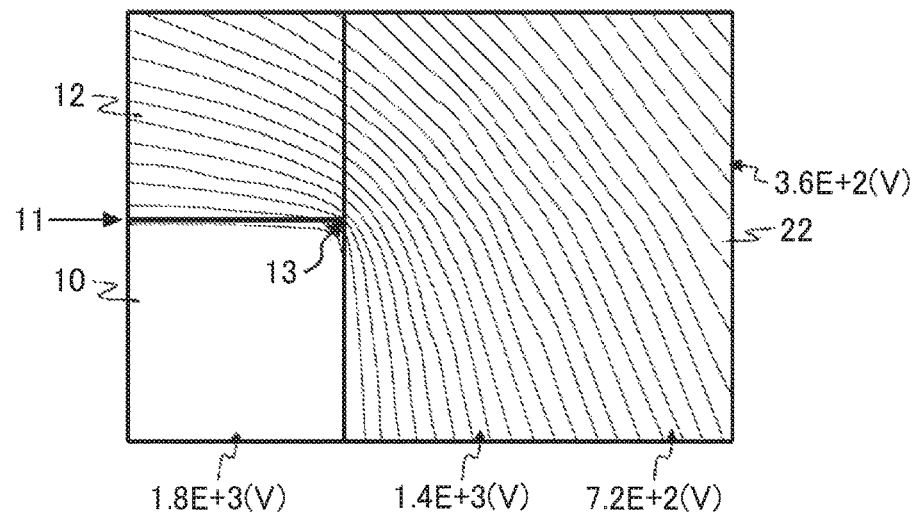

In FIG. 5, (A) is an enlarged diagram of main part showing a result of simulating a potential distribution in a case where the inner part 22 is silicone resin. In FIG. 5, (B) is an enlarged diagram of main part showing a result of simulating a potential distribution in a case where the inner part 22 is $Al_2O_3$. In FIG. 5, The intervals of the equipotential lines on the boundary 11 in the vicinity of the outer end 13 are narrower in (B) rather than (A). Therefore, it is assumed that a higher voltage rather than the silicone resin has been applied to the vicinity of the outer end 13 and then the insulation breakdown occurred at $Al_2O_3$. The critical electric field strength when the insulation breakdown occurred at $Al_2O_3$ is $10^6$ V/cm which is the same level as the critical electric field strength of SiC.

It should be noted that in the inner part 22, instead of the silicone resin (having a relative permittivity of 3.5), in a case where the silicon oxide film (having a relative permittivity of 3.9) is used, a voltage resistant waveform is obtained, which is approximately the same as that of the silicone resin, as shown in (A) in FIG. 4. That is, the avalanche resistance voltage becomes 1760V. Accordingly, as a design guideline for voltage resistant characteristics, the relative permittivity of the insulating material provided to the inner part 22 may be set to 4 or less. However, it is assumed that if the critical electric field strength of the insulating material in the inner part 22 is high, the relative permittivity may not be necessarily 4 or less. That is, it is assumed that although the relative permittivity should be lower than that of the $n^+$-type semiconductor substrate 10, being 4 or less is not a necessary condition. In this way, desired voltage resistant characteristics can be obtained by selecting an insulating material with an appropriate relative permittivity and a critical electric field strength.

Figure 6A:
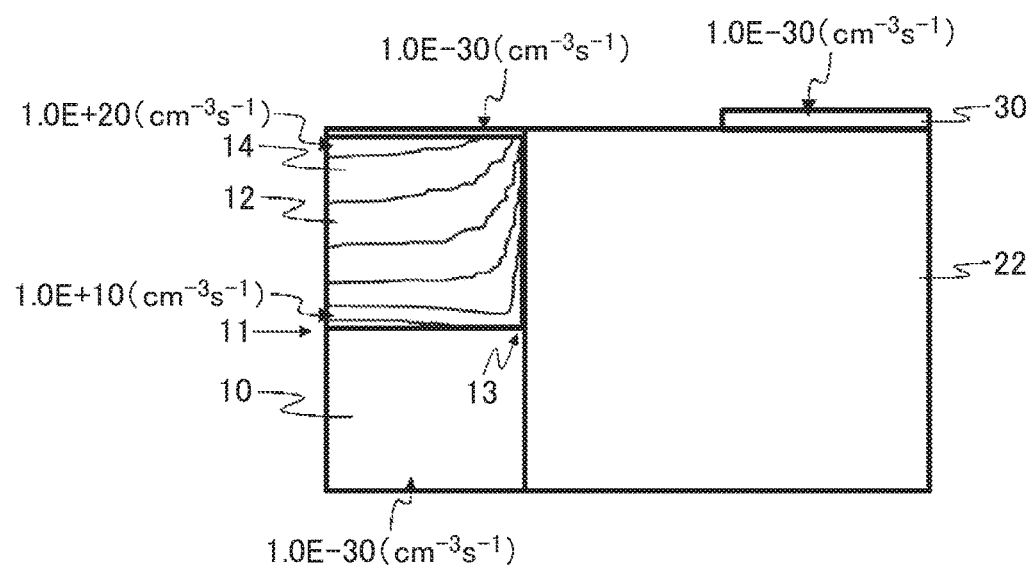
FIG. 6A is an enlarged diagram of main part showing a distribution of impact ionization.
Figure 6B:
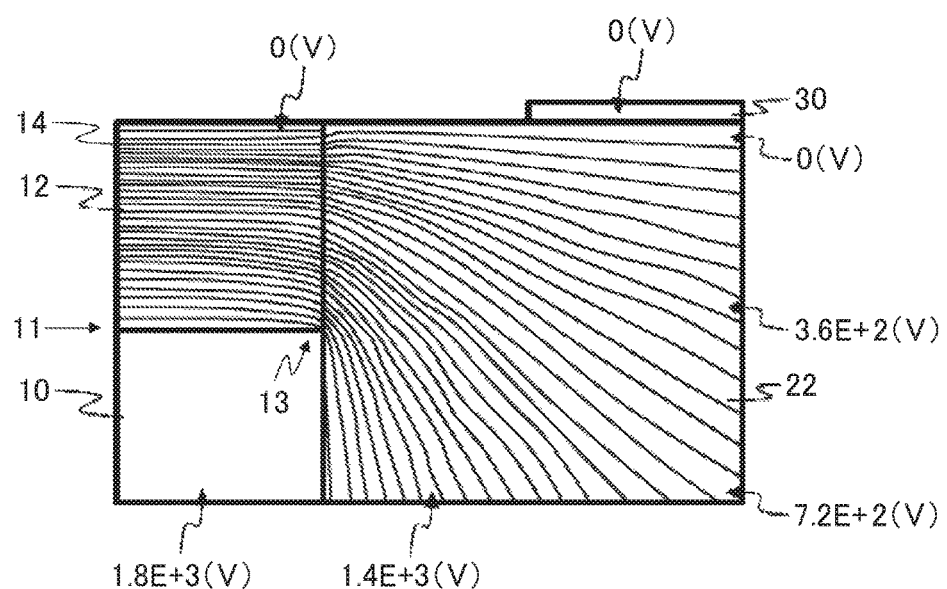
FIG. 6B is an enlarged diagram of main part showing a potential distribution.
Figure 6C:
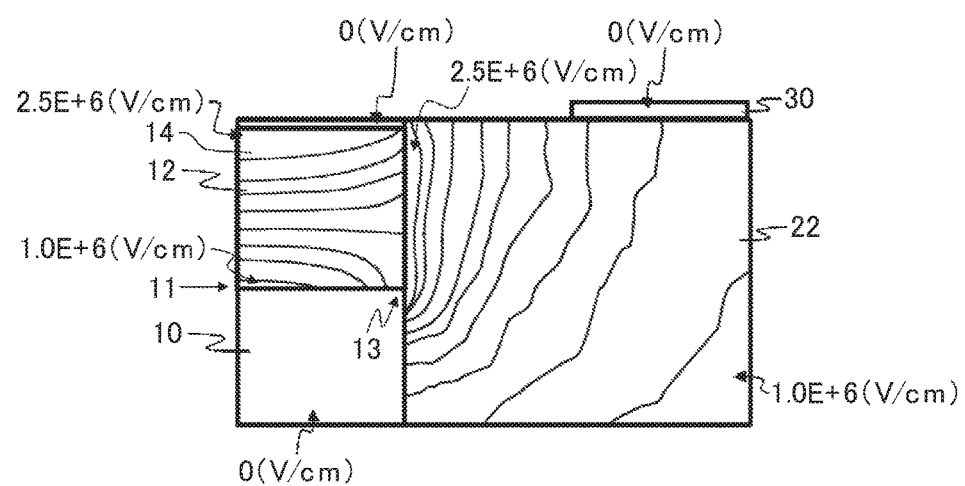
FIG. 6C is an enlarged diagram of main part showing a distribution of electric field strength.

FIG. 6A to FIG. 6C are simulation results showing states where the avalanche breakdown occurs in a case where silicone resin is used in the inner part 22. FIG. 6A is an enlarged diagram of main part showing a distribution of impact ionization. FIG. 6B is an enlarged diagram of main part showing a potential distribution. FIG. 6C is an enlarged diagram of main part showing a distribution of electric field strength.

As shown in FIG. 6A, the impact ionization becomes high at the n-type semiconductor layer 12 and the p-type semiconductor layer 14, and does not occur at the inner part 22. Also, as shown in FIG. 6B, it can be seen that the equipotential lines are distributed at approximately uniform intervals at the inner part 22. It can be said that this is the effect of the resistance section 30 where each equipotential line extends in the Y direction in accordance with the voltage drop. As shown in FIG. 6C, in the region where the n-type semiconductor layer 12, the p-type semiconductor layer 14 and the inner part 22 are contacted with each other, the electric field strength becomes high.

Figure 7:
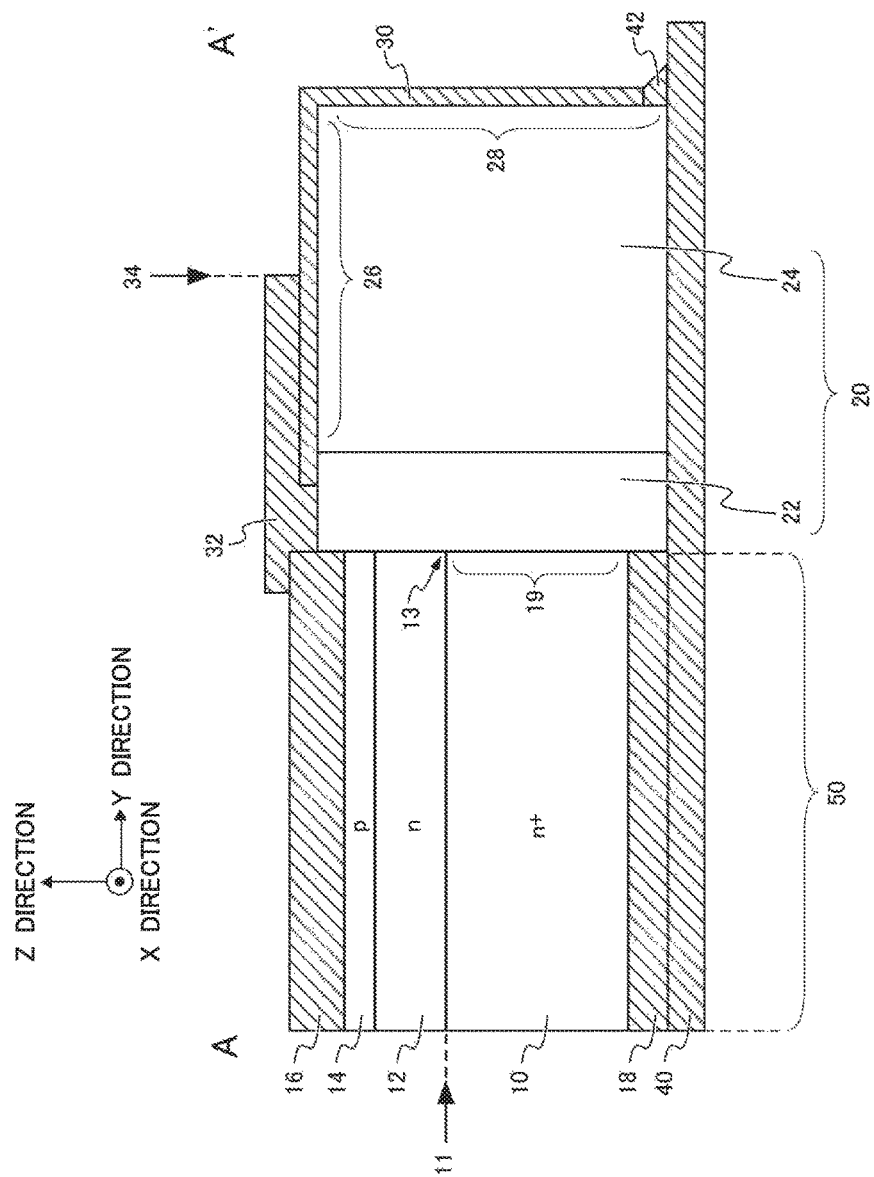
FIG. 7 is a drawing showing an A-A' cross-section in a first modification example.

FIG. 7 is a drawing showing an A-A' cross-section in a first modification example. In the present example, the outer end 34 of the upper conductive member 32 is positioned above the outer part 24 of the extension section 20. The above-described configuration is different from the first embodiment. The other configurations are the same as the first embodiment. In this case, the potential of the upper conductive member 32 up to the position of the outer end 34 is the same as that of the anode electrode 16. For this reason, the physical length of the resistance section 30, which contributes to share the potential, becomes shorter compared to the first embodiment. However, compared to the first embodiment, it is advantageous to easily form the upper conductive member 32 by thermal spraying.

Figure 8:
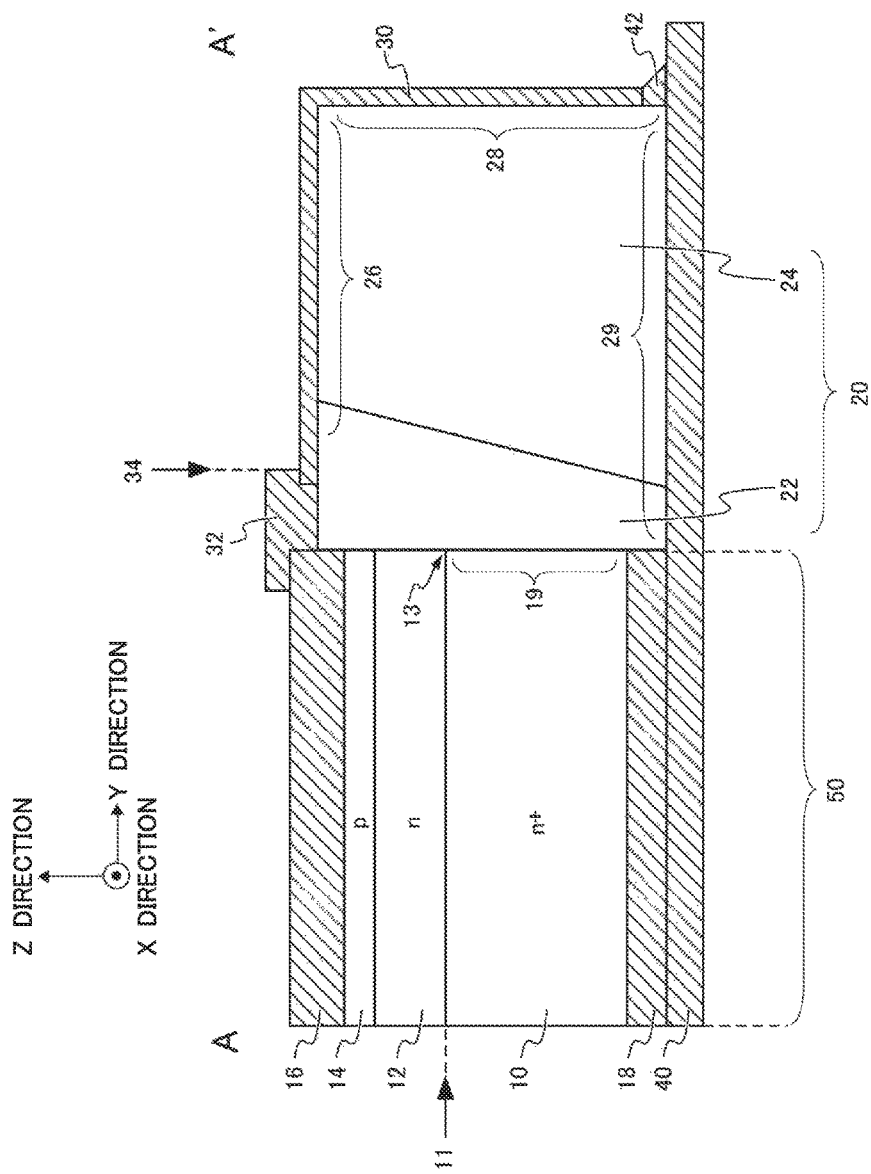
FIG. 8 is a drawing showing an A-A' cross-section in a second modification example.

FIG. 8 is a drawing shown an A-A' cross-section in a second modification example. In the present example, the boundary between the inner part 22 and the outer part 24 is in a tapered shape. The side surface 28 of the outer part 24 may be approximately perpendicular to the conductive plate 40. In the present example, by making the bottom surface 29 of the outer part 24 be longer than the upper surface 26 of the outer part 24, the boundary between the inner part 22 and the outer part 24 is set to be in the tapered shape. The above-described configuration is different from the first embodiment. The other configurations are the same as the first embodiment. If the silicone resin as a material for the inner part 22 is poured to form in the space between the outer part 24 and the diode element section 50, it is advantageous to easily pour the silicone resin.

Figure 9:
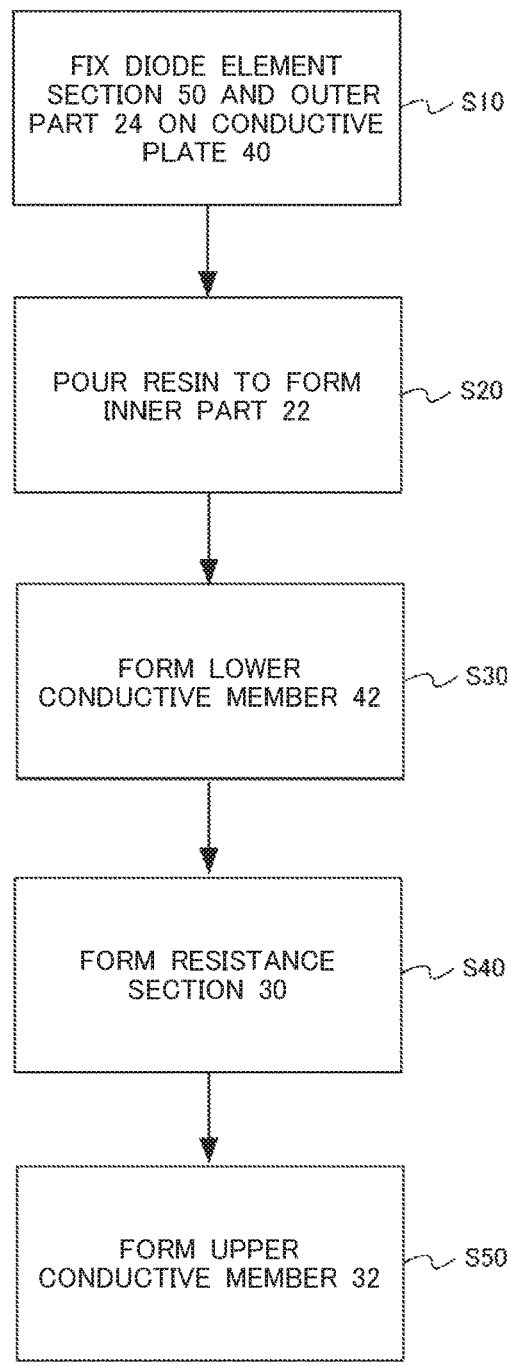
FIG. 9 is a flow diagram showing a manufacturing flow 200 of the semiconductor device 100.

FIG. 9 is a flow diagram showing a manufacturing flow 200 of the semiconductor device 100. First, the diode element section 50 and the outer part 24 are spaced from each other and are fixed on the conductive plate 40 (step S10). After that, the resin is poured in gaps of the diode element section 50 and the outer part 24 and then the inner part 22 is formed (step S20). Furthermore, after that, the lower conductive member 42 is formed (step S30). After that, the resistance section 30 is thermally sprayed (step S40). Finally, the upper conductive member 32 is formed (step S50).

Figure 10:
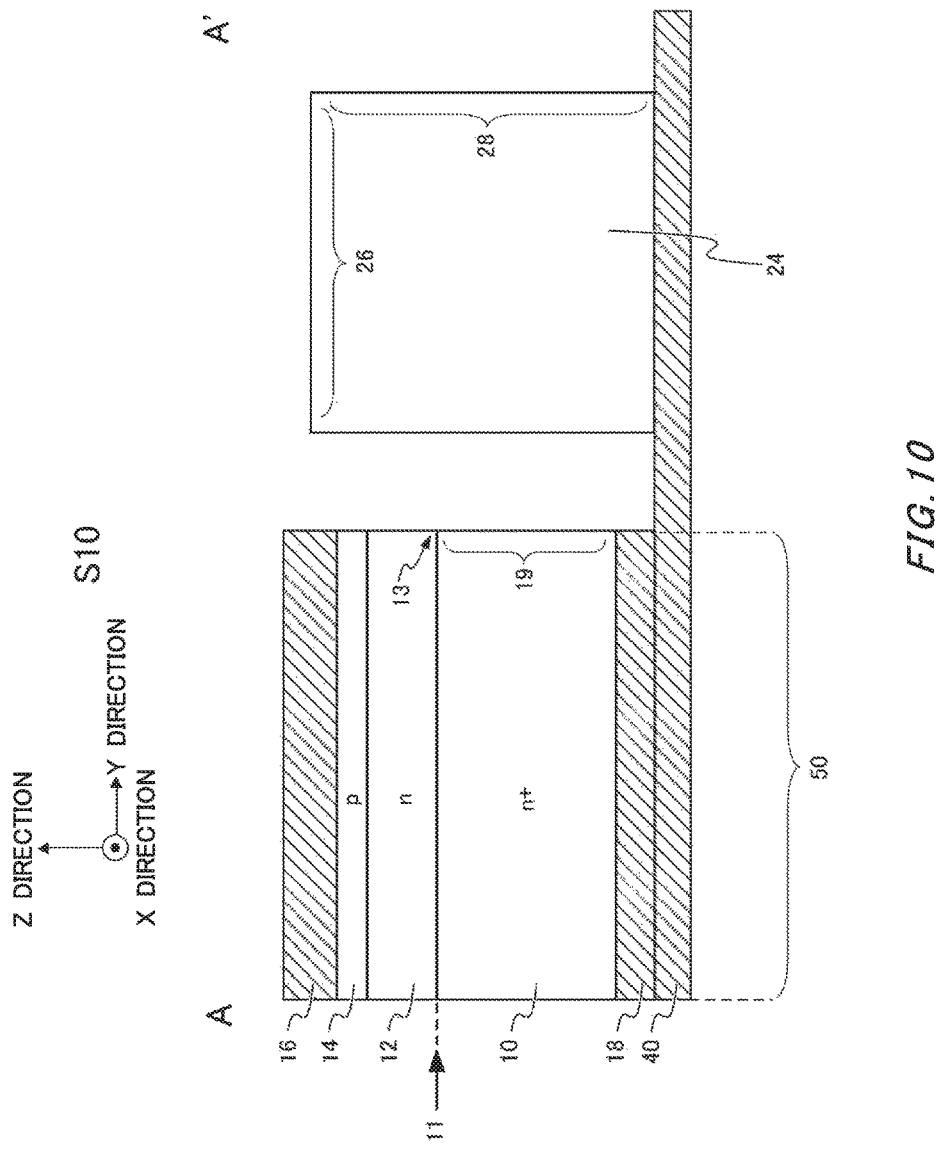
FIG. 10 is a drawing showing a step S10 of fixing an $n^+$-type semiconductor substrate 10 and an outer part 24 on a conductive plate 40.

FIG. 10 is a drawing showing the step S10 of fixing the n$^+$-type semiconductor substrate 10 and the outer part 24 on the conductive plate 40. At the step S10, the cathode electrode 18 provided below the n$^+$-type semiconductor substrate 10 and the outer part 24 are fixed on the conductive plate 40 via a conductive adhesive. The outer part 24 is spaced from the side surface 19 of the n$^+$-type semiconductor substrate 10 and surrounds the side surface 19.

Figure 11:
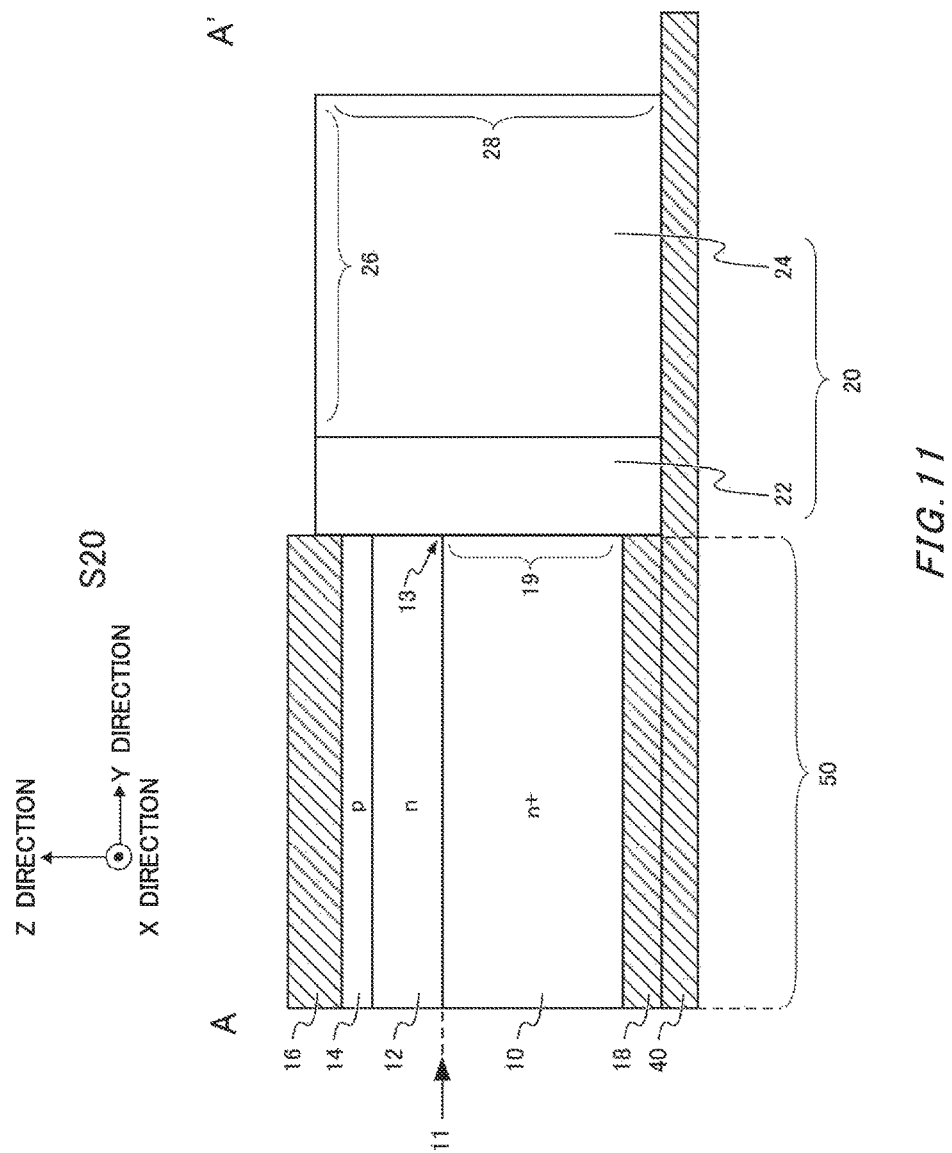
FIG. 11 is a drawing showing a step S20 of forming the inner part 22 by pouring resin.

FIG. 11 is a drawing showing the step S20 of pouring resin to form the inner part 22. The inner part 22 may be silicone resin. The silicone resin is poured between the n$^+$-type semiconductor substrate 10 and the outer part 24 and is cured, and then the inner part 22 is formed.

Figure 12:
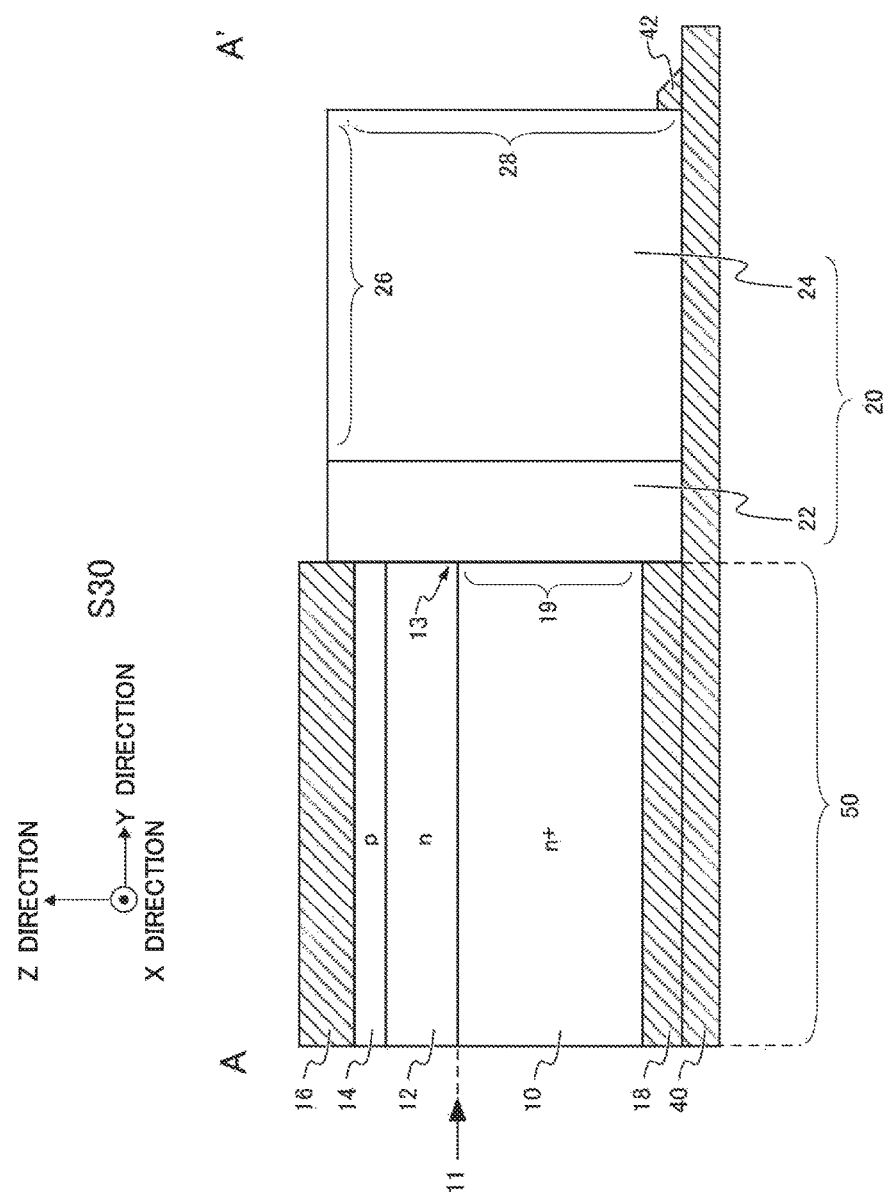
FIG. 12 is a drawing showing a step S30 of forming a lower conductive member 42.

FIG. 12 is a drawing showing the step S30 of forming the lower conductive member 42. As described above, the lower conductive member 42 of the present example may be Al formed by plating. The lower conductive member 42 ensures the electrical connection between the resistance section 30 and the conductive plate 40.

Figure 13:
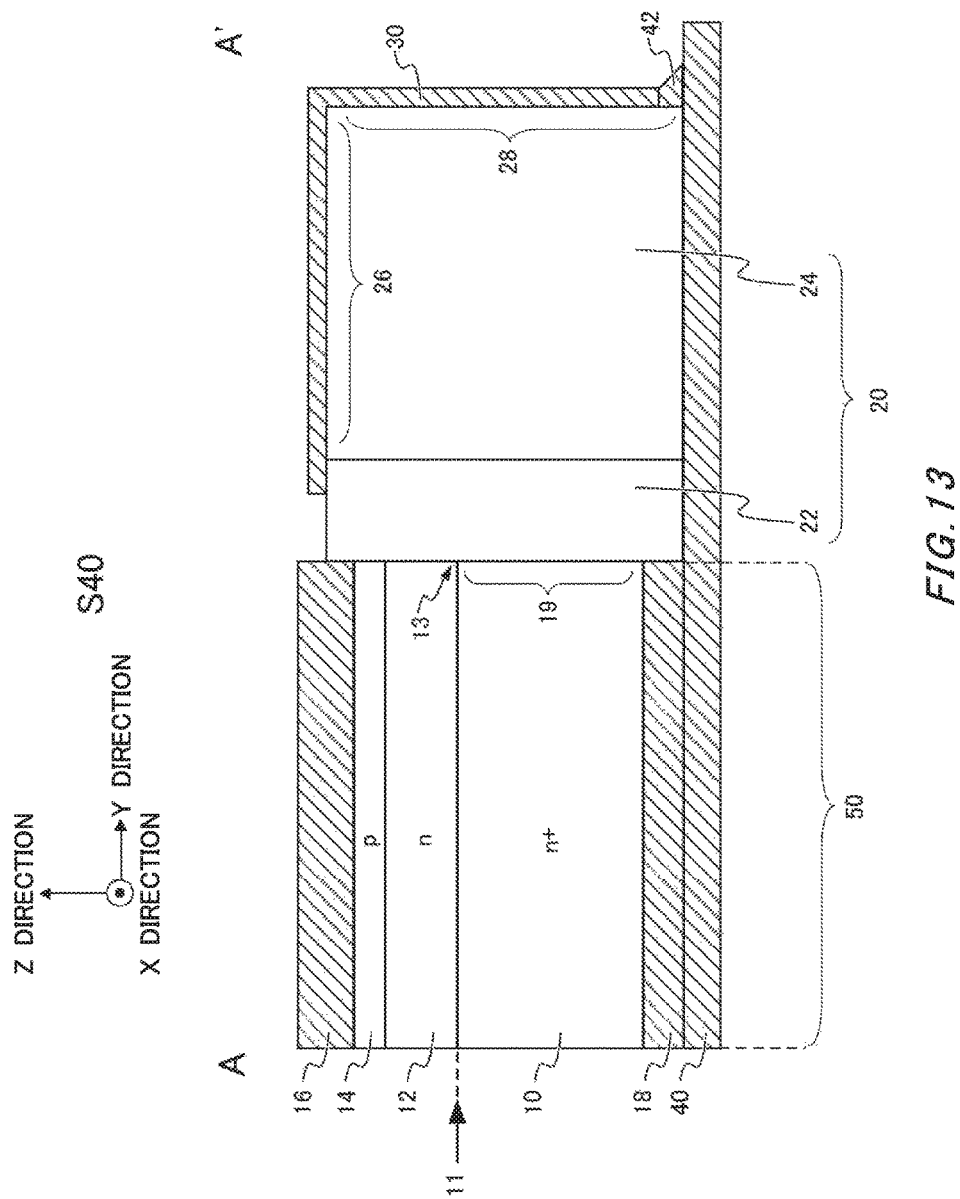
FIG. 13 is a drawing showing a step S40 of forming a resistance section 30 by thermal spraying.

FIG. 13 is a drawing showing the step S40 of forming the resistance section 30 by thermal spraying. As described above, the resistance section 30 of the present example may be formed by thermal spraying. The resistance section 30 electrically connects the conductive plate 40 and the cathode electrode 18 through the lower conductive member 42. Also, the resistance section 30 is electrically connected to the anode electrode 16 through the upper conductive member 32.

Figure 14:
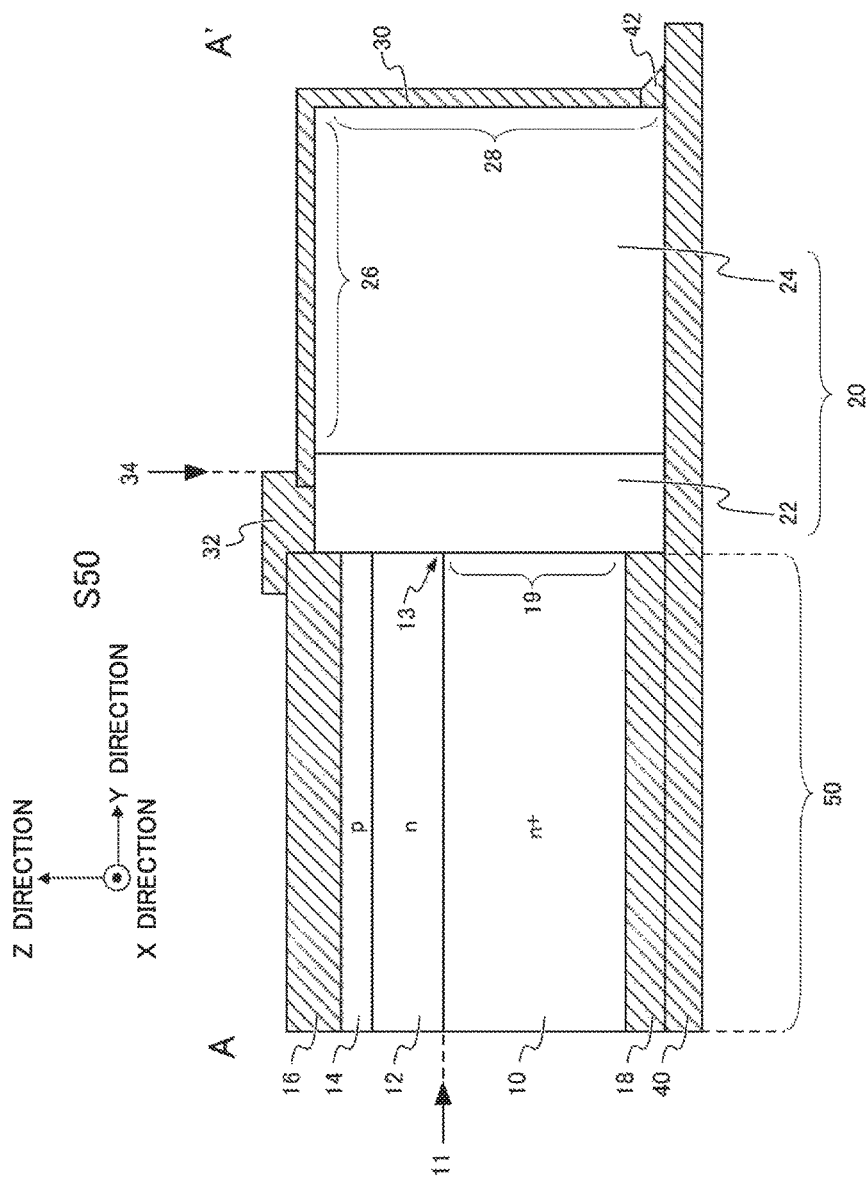
FIG. 14 is a drawing showing a step S50 of forming an upper conductive member 32 by thermal spraying.

FIG. 14 is a drawing showing the step S50 of forming the upper conductive member 32 by thermal spraying. As described above, the upper conductive member 32 of the present example may be Al formed by thermal spraying. Accordingly, the electrical connection between the anode electrode 16 and the resistance section 30 is ensured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to", "before" or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . n$^+$-type semiconductor substrate, 11 . . . boundary, 12 . . . n-type semiconductor layer, 13 . . . outer end, 14 . . . p-type semiconductor layer, 16 . . . anode electrode, 18 . . . cathode electrode, 19 . . . side surface, 20 . . . extension section, 22 . . . inner part, 24 . . . outer part, 26 . . . upper surface, 28 . . . side surface, 29 . . . bottom surface, 30 . . . resistance section, 32 . . . upper conductive member, 34 . . . outer end, 40 . . . conductive plate, 42 . . . lower conductive member, 50 . . . diode element section, 100 . . . semiconductor device, 200 . . . manufacturing flow

What is claimed is:

1. A manufacturing method of a semiconductor device having a voltage resistant structure, the manufacturing method of the semiconductor device comprising:

fixing a rear surface electrode and an outer part on a conductive plate via a conductive adhesive, the rear surface electrode provided below a semiconductor substrate, and the outer part spaced from a side surface of the semiconductor substrate, surrounding the side surface and having a lower permittivity than the semiconductor substrate, and the conductive plate electrically connected to the rear surface electrode;

forming an inner part by pouring resin between the semiconductor substrate and the outer part; and after forming the inner part, forming a resistance section by thermal spraying on at least one of an upper surface and a side surface of an extension section having the outer part and the inner part, the resistance section electrically connected to a front surface electrode above the semiconductor substrate and to the rear surface electrode.

2. The manufacturing method of the semiconductor device according to claim 1, further comprising:

forming an upper conductive member which electrically connects the front surface electrode to the resistance section on the extension section.

3. The manufacturing method of the semiconductor device according to claim 1, further comprising:
   forming a lower conductive member which electrically connects the conductive plate to the resistance section provided to the outer part of the extension section.

* * * * *